United States Patent
Itou et al.

(10) Patent No.: US 8,610,487 B2
(45) Date of Patent: Dec. 17, 2013

(54) ELECTRONIC DEVICE WITH SWITCHING ELEMENT DRIVEN BY CONTROL VOLTAGE

(75) Inventors: Akito Itou, Kariya (JP); Tsuneo Maebara, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 13/268,081

(22) Filed: Oct. 7, 2011

(65) Prior Publication Data

US 2012/0086496 A1   Apr. 12, 2012

(30) Foreign Application Priority Data

Oct. 7, 2010   (JP) .................................. 2010-227418

(51) Int. Cl.
*H03K 17/28* (2006.01)

(52) U.S. Cl.
USPC ............................ 327/398; 327/429; 363/123

(58) Field of Classification Search
USPC ........... 327/112, 108, 109, 111, 398; 307/9.1, 307/10.1; 318/445–489; 363/123
See application file for complete search history.

(56) References Cited

U.S. PATENT DOCUMENTS

| | | | | |
|---|---|---|---|---|
| 4,899,065 A | * | 2/1990 | Nakamura | 327/109 |
| 5,089,719 A | * | 2/1992 | Kamei et al. | 327/109 |
| 5,120,991 A | * | 6/1992 | Takahashi | 327/108 |
| 7,586,726 B2 | * | 9/2009 | Maebara et al. | 361/93.8 |
| 8,339,084 B2 | * | 12/2012 | Welchko | 318/445 |
| 8,363,440 B2 | * | 1/2013 | Tagome et al. | 363/131 |
| 8,395,338 B2 | * | 3/2013 | Kuroda et al. | 318/400.11 |
| 2008/0007318 A1 | * | 1/2008 | Pace et al. | 327/396 |
| 2010/0141304 A1 | * | 6/2010 | Miyazaki | 327/109 |
| 2012/0086496 A1 | * | 4/2012 | Itou et al. | 327/398 |

FOREIGN PATENT DOCUMENTS

| | | | | |
|---|---|---|---|---|
| JP | 61120521 | A | * | 6/1986 |
| JP | 2002076880 | A | * | 3/2002 |
| JP | P3430878 | | | 5/2003 |
| JP | 2009-290287 | | | 10/2009 |
| JP | 2010-034746 | | | 2/2010 |
| JP | 2010153704 | A | * | 7/2010 |

OTHER PUBLICATIONS

Japanese Official Action dated Sep. 18, 2012 issued in corresponding Japanese Application No. 2010-227418, with English translation.

* cited by examiner

*Primary Examiner* — Nguyen Tran
*Assistant Examiner* — Afework Demisse
(74) *Attorney, Agent, or Firm* — Nixon & Vanderhye PC (57) ABSTRACT

In an electronic device with a switching element, a control circuit controls the voltage at the control terminal of the switching element and drives the switching element, by controlling an ON-drive switching element and an OFF-drive switching element based on an inputted drive signal to the control circuit. The control circuit is configured to turn OFF a switching element using a switching circuit other than the OFF-drive switching element after an elapse of a predetermined period of time from a timing at which the drive signal switches from an ON instruction thereof to an OFF instruction thereof, the ON instruction giving an instruction to turn ON the switching element, the OFF instruction giving an instruction to turn OFF the switching element.

18 Claims, 4 Drawing Sheets

ELECTRONIC DEVICE WITH SWITCHING ELEMENT DRIVEN BY CONTROL VOLTAGE

CROSS-REFERENCE TO RELATED APPLICATION

This application is based on and claims the benefit of priority from earlier Japanese Patent Application No. 2010-227418 filed Oct. 7, 2010 the description of which is incorporated herein by reference.

BACKGROUND OF THE INVENTION

1. Field of the Invention

The present invention relates to an electronic device including switching elements and a drive circuit for the switching elements.

2. Description of the Related Art

A power converter disclosed, for example, in Japanese Patent Publication No. 3430878 is conventionally known as an electronic device including a switching element and a drive circuit.

The power converter includes an insulated-gate bipolar transistor (IGBT), three metal-oxide-semiconductor field-effect transistors (MOSFETs), and a control circuit. The source of a first MOSFET is connected to a drive-circuit power source, the drain is connected to the gate of the IGBT, and the gate is connected to the control circuit. The sources of the second and third MOSFETs are connected to the emitter of the IGBT, the drains are connected to the gate of the IGBT, and the gates are connected to the control circuit.

The control circuit drives the IGBT by controlling the three MOSFETs based on a drive signal inputted from an external source. When the drive signal gives an instruction to turn ON the IGBT, the control circuit turns ON the first MOSFET and turns OFF the second MOSFET. As a result, the gate of the IGBT is charged with electrical charge from the drive-circuit power source. Therefore, the gate voltage becomes higher than an ON/OFF threshold voltage, and the IGBT is turned ON.

On the other hand, when the drive signal gives an instruction to turn OFF the IGBT, the control circuit turns OFF the first MOSFET and turns ON the second MOSFET. As a result, electrical charge is discharged from the gate of the IGBT. Therefore, the gate voltage becomes lower than the ON/OFF threshold voltage, and the IGBT is turned OFF. Then, when the gate voltage reaches a predetermined value or lower, the control circuit turns ON the third MOSFET. As a result, electrical charge is further discharged from the gate of the IGBT, and the OFF-state of the IGBT is held.

In the above-described power converter, when failure occurs in the IGBT, the first MOSFET, or the second MOSFET, an abnormal state may occur in which the gate voltage of the IGBT does not decrease and the IGBT cannot be turned OFF regardless of the drive signal giving the instruction to turn OFF the IGBT. When an abnormal state such as this continues, the IGBT may generate heat and become thermally damaged.

SUMMARY

It is thus desired to provide an electronic device capable of preventing thermal damage to a switching element, even in an instance in which a voltage of a control terminal of a switching element equivalent to an IGBT does not decrease and the switching element cannot be turned OFF regardless of a drive signal giving an instruction to turn OFF the switching element.

Through keen studies and trial-and-errors conducted to solve the above-described issues, the inventors of the present invention have found that, even in an instance in which the voltage of the control terminal does not decrease and the switching element cannot be turned OFF regardless of the drive signal giving an instruction to turn OFF the switching element, thermal fracture of the switching element can be prevented by the switching element being turned OFF using a time drive circuit (or a switching circuit) other than the OFF-drive switching element, after the elapse of a predetermined period of time from a timing at which the drive signal switches from that giving an instruction to turn ON the switching element to that giving an instruction to turn OFF the switching element.

In other words, an electronic device according to a first aspect is an electronic device that includes: a switching element that is driven by a voltage of a control terminal being controlled; an ON-drive switching element that is connected to the control terminal of the switching element and charges the control terminal of the switching element with electrical charge by being turned ON; an OFF-drive switching element that is connected to the control terminal of the switching element and discharges electrical charge from the control terminal of the switching element by being turned ON; and a control circuit that controls the voltage of the control terminal of the switching element and drives the switching element, by controlling the ON-drive switching element and the OFF-drive switching element based on an inputted drive signal. The control circuit turns OFF the switching element using the time drive circuit (e.g., the switching circuit) other than the OFF-drive switching element after an elapse of a predetermined period of time from a timing at which the drive signal switches from that giving an instruction to turn ON the switching element to that giving an instruction to turn OFF the switching element.

According to the configuration, in a normal state, when the drive signal switches from that giving an instruction to turn ON the switching element to that giving an instruction to turn OFF the switching element, the control circuit turns OFF the ON-drive switching element and turns ON the OFF-drive switching element. As a result, electrical charge is discharged from the control terminal of the switching element. Therefore, the voltage of the control terminal becomes lower than an ON/OFF threshold voltage, and the switching element is subsequently turned OFF. When failure occurs in the switching element, the ON-drive switching element, or the OFF-drive switching element, an abnormal state may occur in which the voltage of the control terminal of the switching element does not decrease even when the drive signal switches from the ON to the OFF state. In this instance, the switching element does not turn OFF. However, the control circuit turns OFF the switching element using the time drive circuit other than the OFF-drive switching element after the elapse of a predetermined period of time after the timing at which the drive signal switches from that giving the ON instruction to that giving the OFF instruction. As a result, the switching element can be turned OFF even when the voltage of the control terminal of the switching element does not decrease. Therefore, thermal damage to the switching element can be prevented.

In the electronic device according to a second embodiment, the control circuit turns OFF the switching element using the time drive circuit other than the OFF-drive switching element after the timing at which the drive signal switches from that giving the instruction to turn ON the switching element to that giving the instruction to turn OFF the switching element and the OFF-drive switching element is turned ON, and after the predetermined period of time has elapsed from the timing at which the drive signal switches from that giving the instruction to turn ON the switching element to that giving the instruction to turn OFF the switching element. According to the configuration, when the drive signal switches from that giving the instruction to turn ON the switching element to that giving the instruction to turn OFF the switching element, the control circuit turns ON the OFF-drive switching element. Then, the switching element is subsequently turned OFF by the time drive circuit other than the OFF-drive switching element. Therefore, the switching element can be turned OFF even when the voltage of the control terminal of the switching element does not decrease, without affecting the operations of the control circuit, namely turning OFF the OFF-drive switching element.

BRIEF DESCRIPTION OF THE DRAWINGS

In the accompanying drawings.

DETAILED DESCRIPTION OF THE PREFERRED EMBODIMENTS

The present invention will be described in detail according to an embodiment. According to the embodiment, an electronic device of the present invention is applied to a motor control apparatus that is mounted in a vehicle and controls a vehicle-drive motor.

First, a configuration of the motor control apparatus according to the present embodiment will be described with reference to FIG. 1. Here, FIG. 1 is a circuit diagram of the motor control apparatus according to the present embodiment.

Figure 1:
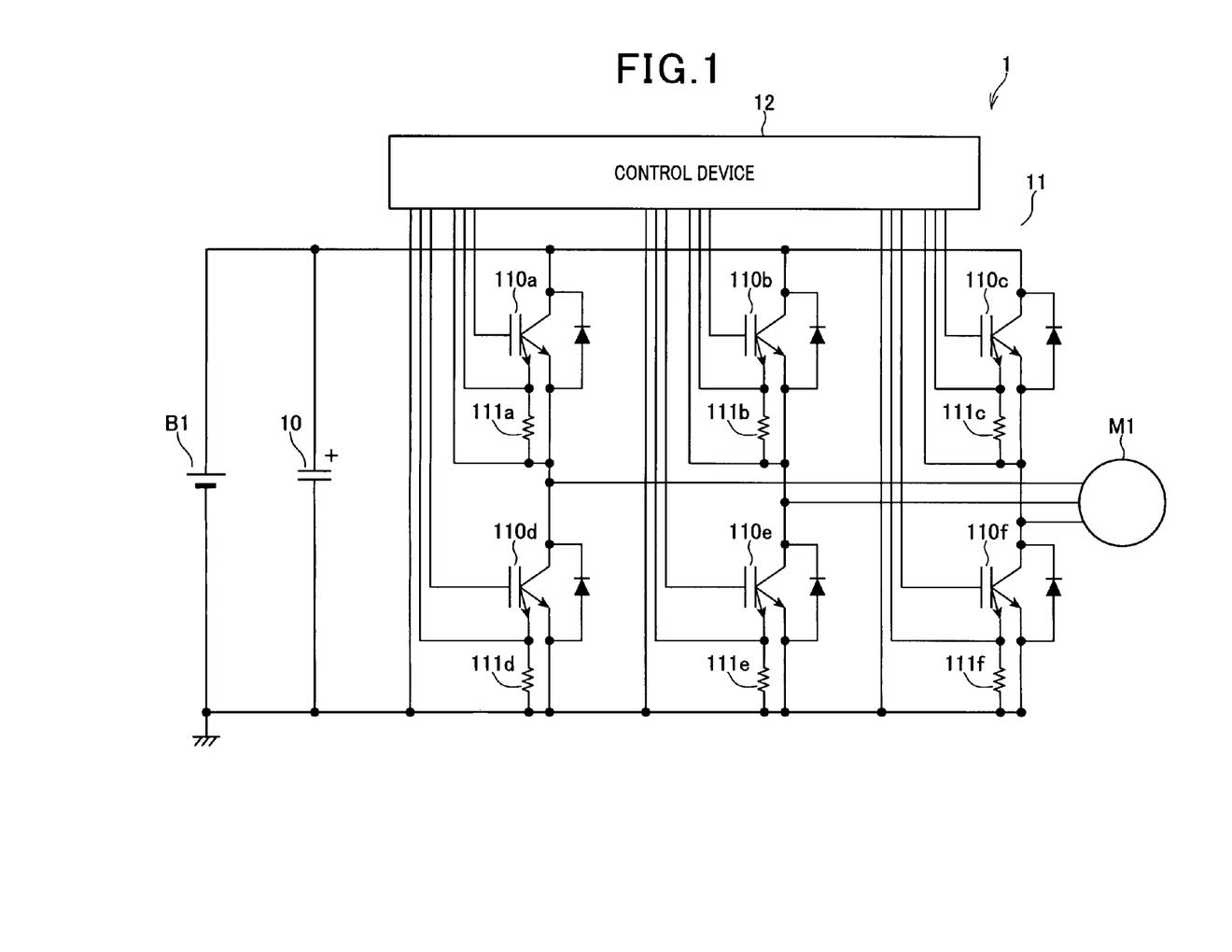
FIG. 1 is a circuit diagram of a motor control apparatus according to a present embodiment.

A motor control apparatus 1 (electronic device) shown in FIG. 1 is a device that controls a vehicle-drive motor M1 by converting high voltage direct-current (such as 288 Volts) outputted from a high-voltage battery B1 insulated from the vehicle body to three-phase alternating-current voltage, and supplying the three-phase alternating current voltage to the vehicle-drive motor M1. The motor control apparatus 1 includes a smoothing capacitor 10, an inverter device 11, and a control device 12.

The smoothing capacitor 10 is an element used to smooth the high direct-current voltage of the high-voltage battery B1. One end of the smoothing capacitor 10 is connected to the positive terminal of the high-voltage battery B1, and the other end is connected to the negative terminal of the high-voltage battery B1. Furthermore, the negative terminal of the high-voltage battery B1 is connected to a high-voltage-battery ground that is insulated from the vehicle body.

The inverter device 11 is a device that converts the direct-current voltage smoothened by the smoothing capacitor 10 to the three-phase alternating-current voltage, and supplies the three-phase alternating-current voltage to the vehicle-drive motor M1. The inverter device 11 includes IGBTs 110a to 110f (switching elements) and current-sensing resistors 111a to 111f.

The IGBTs 110a to 110f are switching elements that are driven by the voltage of the gate (control terminal) being controlled, and are used to convert the direct-current voltage smoothened by the smoothing capacitor 10 to the three-phase alternating-current voltage by being turned ON and OFF. The IGBTs 110a to 110f each include a current-sensing terminal through which a current smaller than the collector current flows, in proportion with the collector current. The IGBTs 110a and 110d, the IGBTs 110b and 110e, and the IGBTs 110c and 110f are each connected in series. Specifically, the emitters of the IGBTs 110a to 110c are respectively connected to the collectors of the IGBTs 110d to 110f. The three pairs of serially connected IGBTs, namely the IGBTs 110a and 110d, the IGBTs 110b and 110e, and the IGBTs 110c and 110f, are connected in parallel. The collectors of the IGBTs 110a to 110c are connected to one end of the smoothing capacitor 10. The emitters of the IGBTs 110d to 110f are connected to the other end of the smoothing capacitor 10. In addition, the gates and emitters of the IGBTs 110a to 110f are each connected to the control device 12. Furthermore, the serial connection points of the serially connected IGBTs 110a and 110d, IGBTs 110b and 110e, and IGBTs 110c and 110f are each connected to the vehicle drive motor M1.

The current-sensing resistors 111a to 111f are elements used to convert the current flowing to the IGBTs 110a to 110f to voltage. Specifically, the current-sensing resistors 111a to 111f are elements that convert the current flowing to the current-sensing terminals to voltage. One end of each current-sensing resistor 111a to 111f is connected to the current-sensing terminal of the corresponding IGBT 110a to 110f, and the other end is connected to the emitter of the corresponding IGBT 110a to 110f. Both ends of each current-sensing resistor 111a to 111f are connected to the control device 12.

The control device 12 is a device that controls the IGBT 110a to 110f. The control device 12 is connected to the gate and emitter of each IGBT 110a to 110f. In addition, the control device 12 is also connected to both ends of each current-sensing resistor 111a to 111f to detect the current flowing to the IGBTs 110a to 110f.

Figure 2:
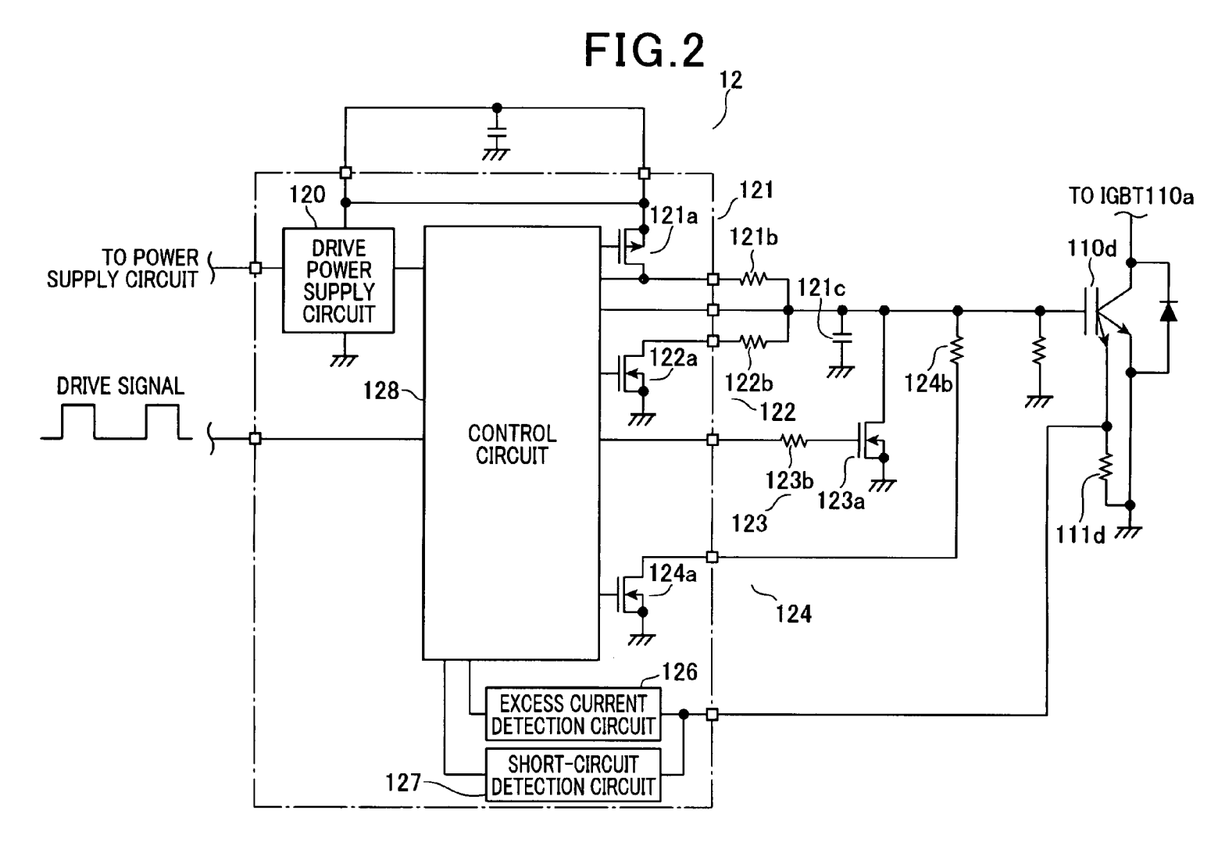
FIG. 2 is a circuit diagram of a control device in FIG. 1.

Next, the control device 12 will be described in detail with reference to FIG. 2. Here, FIG. 2 is a circuit diagram of the control device 12 in FIG. 1. Specifically, FIG. 2 is a circuit diagram of a circuit section for one IGBT.

As shown in FIG. 2, the control device 12 includes, for the IGBT 110d, a drive power supply circuit 120, an ON-drive circuit 121, an OFF-drive circuit 122, an OFF-holding circuit 123, a disconnecting circuit 124, an excess current detection circuit 126, a short-circuit detection circuit 127, and a control circuit 128. The control device 12 similarly includes a drive power supply circuit, an ON-drive circuit, an OFF-drive circuit, an OFF-holding circuit, a disconnecting circuit, an excess current detection circuit, a short-circuit detection circuit, and a control circuit for each of the other IGBTs 110a to 110c, 110e, and 110f.

The drive power supply circuit 120 is a circuit that supplies a voltage for driving the IGBT 110d. The drive power supply circuit 120 stabilizes the voltage supplied from a power supply circuit (not shown) and outputs the stabilized voltage. The input terminal of the drive power supply circuit 120 is connected to the power supply circuit. The positive terminal is connected to the ON-drive circuit 121. The negative terminal is connected to the high-voltage-battery ground that is insulated from the vehicle body, and is connected to the emitter of the IGBT 110*d* with the high-voltage-battery ground therebetween. Furthermore, the control terminal is connected to the control circuit 128.

The ON-drive circuit 121 is a circuit used to turn ON the IGBT 110*d*. Specifically, the ON-drive circuit 121 charges the gate of the IGBT 110*d* with electrical charge, increases the gate voltage to become higher than an ON/OFF threshold voltage, and turns ON the IGBT 110*d*. The ON-drive circuit 121 includes an ON-drive FET 121*a* (ON-drive switching element), an ON-drive resistor 121*b*, and an ON-drive capacitor 121*c*.

The ON-drive FET 121*a* is a switching element that is driven by the voltage of the gate being controlled, and charges the gate of the IGBT 110*d* with electrical charge by being turned ON. Specifically, the ON-drive FET 121*a* is a P-channel MOSFET. The source of the ON-drive FET 121*a* is connected to the positive terminal of the drive power supply circuit 120. The drain is connected to the gate of the IGBT 110*d* with the ON-drive resistor 121*b* therebetween. Furthermore, the gate is connected to the control circuit 128. One end of the ON-drive capacitor 121*c* is connected to the gate of the IGBT 110*d*. The other end is connected to the high-voltage-battery ground that is insulated from the vehicle body, and is connected to the negative terminal of the drive power supply circuit 120 and the emitter (output terminal) of the IGBT 110*d* with the high-voltage-battery ground therebetween.

The OFF-drive circuit 122 is a circuit used to turn OFF the IGBT 110*d*. Specifically, the OFF-drive circuit 122 discharges electrical charge from the gate of the IGBT 110*d*, decreases the gate voltage to become lower than the ON/OFF threshold voltage, and turns OFF the IGBT 110*d*. The OFF-drive circuit 122 includes an OFF-drive FET 122*a* (OFF-drive switching element) and an OFF-drive resistor 122*b*.

The OFF-drive FET 122*a* is a switching element that is driven by the voltage of the gate being controlled, and discharges electrical charge from the gate of the IGBT 110*d* by being turned ON. Specifically, the OFF-drive FET 122*a* is an N-channel MOSFET. The source of the OFF-drive FET 122*a* is connected to the high-voltage-battery ground that is insulated from the vehicle body, and is connected to the negative terminal of the drive power supply circuit 120 and the emitter of the IGBT 110*d* with the high-voltage-battery ground therebetween. The drain is connected to the gate of the IGBT 110*d* with the OFF-drive resistor 122*b* therebetween. Furthermore, the gate is connected to the control circuit 128.

The OFF-holding circuit 123 is a circuit that holds the OFF-state of the IGBT 110*d*. Specifically, when the gate voltage of the IGBT 110*d* reaches an OFF-holding threshold or lower, the OFF-holding threshold being lower than the ON/OFF threshold voltage, the OFF-holding circuit 123 discharges electrical charge from the gate of the IGBT 110*d* more quickly than the OFF-drive circuit 122. The OFF-holding circuit 123 decreases the gate voltage to become lower than the ON/OFF threshold voltage, and holds the OFF-state of the IGBT 110*d*. The OFF-holding circuit 123 includes an OFF-holding FET 123*a* (OFF-holding switching element) and a gate resistor 123*b*.

The OFF-holding FET 123*a* is a switching element that is driven by the voltage of the gate being controlled, and discharges electrical charge from the gate of the IGBT 110*d* by being turned ON. Specifically, the OFF-holding FET 123*a* is an N-channel MOSFET. The source of the OFF-holding FET 123*a* is connected to the high-voltage-battery ground that is insulated from the vehicle body, and is connected to the negative terminal of the drive power supply circuit 120 and the emitter of the IGBT 110*d* with the high-voltage-battery ground therebetween. The drain is connected to the gate of the IGBT 110*d*. Furthermore, the gate is connected to the control circuit 128 with the gate resistor 123*b* therebetween.

The disconnecting circuit 124 is a circuit that turns OFF the IGBT 110*d* when an abnormal current flows to the IGBT 110*d*. Specifically, when an excess current or a short-circuit current (abnormal current) flows to the IGBT 110*d*, the disconnecting circuit 124 discharges electrical charge from the gate of the IGBT 110*d* more gradually than the OFF-drive circuit 122. The block circuit 124 decreases the gate voltage to become lower than the ON/OFF threshold voltage, and turns OFF the IGBT 110*d*. The disconnecting circuit 124 includes a disconnecting FET 124*a* (disconnecting switching element) and a disconnecting resistor 124*b*.

The disconnecting FET 124*a* is a switching element that is driven by the voltage of the gate being controlled, and discharges electrical charge from the gate of the IGBT 110*d* by being turned ON. Specifically, the disconnecting FET 124*a* is an N-channel MOSFET. The source of the disconnecting FET 124*a* is connected to the high-voltage-battery ground that is insulated from the vehicle body, and is connected to the negative terminal of the drive power supply circuit 120 and the emitter of the IGBT 110*d* with the high-voltage-battery ground therebetween. The drain is connected to the gate of the IGBT 110*d* with the disconnecting resistor 124*b* therebetween. Furthermore, the gate is connected to the control circuit 128.

The excess current detection circuit 126 is a circuit that detects whether or not an excess current is flowing to the IGBT 110*d*. Specifically, when the current flowing to the IGBT 110*d* becomes greater than an excess current threshold, the excess current detection circuit 126 judges that an excess current is flowing to the IGBT 110*d*. The input terminal of the excess current detection circuit 126 is connected to one end of the current-sensing resistor 111*d*. The output terminal is connected to the control circuit 128.

The short-circuit detection circuit 127 is a circuit that detects whether or not the IGBT 110*d* is in a short-circuit state. Specifically, when the current flowing to the IGBT 110*d* becomes greater than a short-circuit current threshold that is greater than the excess current threshold, a short-circuit state occurs in which both IGBT 110*a* and IGBT 110*d* are turned ON. The short-circuit detection circuit 127 judges that a short-circuit current is flowing to the IGBT 110*d*. The input terminal of the short-circuit detection circuit 127 is connected to one end of the current-sensing resistor 111*d*. The output terminal is connected to the control circuit 128.

The control circuit 128 controls the ON-drive circuit 121 and the OFF-drive circuit 122 based on a drive signal inputted from an external source, and drives the IGBT 110*d*. In addition, the control circuit 128 controls the OFF-holding circuit 123 based on the gate voltage of the IGBT 110*d*, and holds the OFF-state of the IGBT 110*d*. When an excess current flows to the IGBT 110*d* or when the IGBT 110*d* is in the short-circuit state, the control circuit 128 controls the disconnecting circuit 124 and turns OFF the IGBT 110*d*. Furthermore, after the elapse of a predetermined period of time from a timing at which the drive signal switches from that giving an instruction to turn ON the IGBT 110*d* to that giving an instruction to turn OFF the IGBT 110*d*, the control circuit 128 turns OFF the IGBT 110*d* using a time drive circuit (or a switching circuit) other than the OFF-drive circuit 122 or, to be specific, using the OFF-holding circuit 123. The control circuit 128 is connected to the respective gates of the ON-drive FET 121*a* and the OFF-drive FET 122*a*. The control circuit 128 is also connected to the gate of the IGBT 110*d*. The control circuit 128 is also connected to the gate of the OFF-holding FET 123*a* with the gate resistor 123*b* therebetween. Furthermore, the control circuit 128 is connected to the respective output terminals of the excess current detection circuit 126 and the short-circuit detection circuit 127, and the gate of the disconnecting FET 124a.

The drive power supply circuit 120, the ON-drive FET 121a, the OFF-drive FET 122a, the disconnecting FET 124a, the excess current detection circuit 126, the short-circuit detection circuit 127, and the control circuit 28 are integrally configured as an integrated circuit (IC).

Next, operations of the motor control apparatus 1 will be described with reference to FIG. 1. When an ignition switch (not shown) of the vehicle is turned ON, the motor control apparatus 1 shown in FIG. 1 starts operation. The high direct-current voltage from the high-voltage battery B1 is smoothened by the smoothing capacitor 10. The control device 12 controls the IGBTs 110a to 110f configuring the inverter device 11 based on a drive signal inputted from an external source. Specifically, the control device 12 turns ON and OFF the IGBTs 110a to 110f at a predetermined interval. The inverter device 11 converts the high direct-current voltage smoothened by the smoothing capacitor 10 to three-phase alternating-current voltage and supplies the three-phase alternating-current voltage to the vehicle drive motor M1. In this way, the motor control apparatus 1 controls the vehicle drive motor M1.

Figure 3:
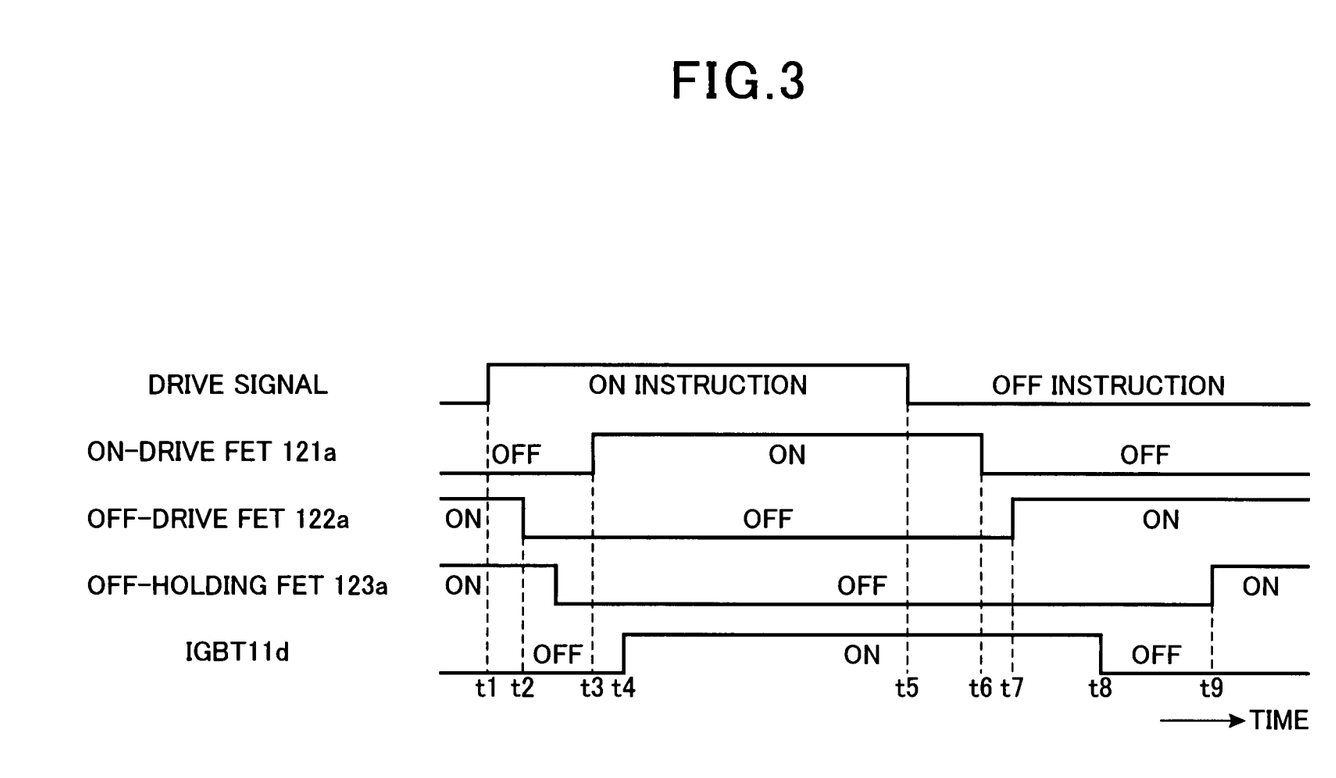
FIG. 3 is a timing chart of a drive signal, an ON-drive FET, an OFF-drive FET, an OFF-holding FET, and an IGBT in a normal state.
Figure 4:
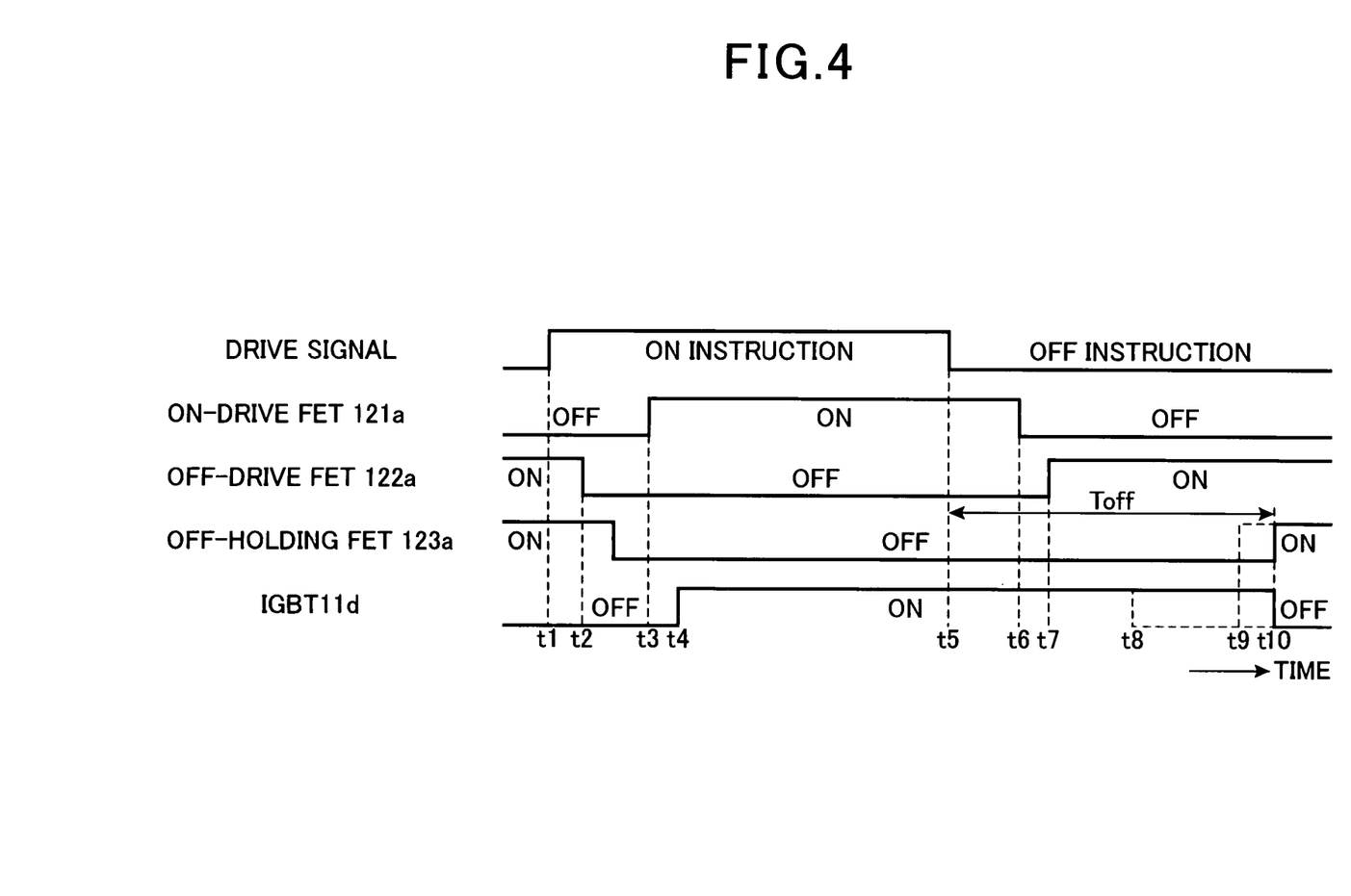
FIG. 4 is a timing chart of the drive signal, the ON-drive FET, the OFF-drive FET, the OFF-holding FET, and the IGBT in an abnormal state in which a gate voltage of the IGBT does not decrease.

Next, driving operations of the IGBT in a normal state, and driving operations of the IGBT when an abnormal state has occurred will be described with reference to FIG. 2 to FIG. 4. In the abnormal state, when an abnormal current flows to the IGBT, the gate voltage of the IGBT does not decrease and the IGBT cannot be turned OFF regardless of the drive signal giving an instruction to turn OFF the IGBT. Here, FIG. 3 is a timing chart of the drive signal, the ON-drive FET 121a, the OFF-drive FET 122a, the OFF-holding FET 123a, and the IGBT 110d in a normal state. FIG. 4 is a timing chart of the drive signal, the ON-drive FET 121a, the OFF-drive FET 122a, the OFF-holding FET 123a, and the IGBT 110d in the abnormal state in which the gate voltage of the IGBT 110d does not decrease. Specifically, FIG. 4 is a timing chart of operation in an abnormal state in which the gate voltage does not decrease even when the ON-drive FET 121a is turned OFF, as a result of failure in the IGBT 110d. Timings t1 to t9 in FIG. 3 are the same as those in FIG. 4.

As shown in FIG. 2, the control circuit 128 controls the ON-drive FET 121a and the OFF-drive FET 122a based on the drive signal inputted from an external source, and drives the IGBT 110d.

As shown in FIG. 3, when the drive signal gives an instruction to turn ON the IGBT 110d (timing t1), the control circuit 128 turns OFF the OFF-drive FET 122a (timing t2) and turns ON the ON-drive FET 121a (timing t3). As a result, the gate of the IGBT 110d is charged with electrical charge from the drive power supply circuit 120, via the ON-drive resistor 121b. Therefore, the gate voltage becomes higher than the ON/OFF threshold voltage, and the IGBT 110d is turned ON (timing t4).

On the other hand, when the drive signal gives an instruction to turn OFF the IGBT 110d (timing t5), the control circuit 128 turns OFF the ON-drive FET 121a (timing t6) and turns ON the OFF-drive FET 122a (timing t7). As a result, electrical charge is discharged from the gate of the IGBT 110d via the OFF-drive resistor 122b. Therefore, the gate voltage becomes lower than the ON/OFF threshold voltage, and the IGBT 110d is turned OFF (timing t8). Then, when the gate voltage reaches the OFF-holding threshold or lower, the OFF-holding threshold being lower than the ON/OFF threshold voltage, the control circuit 128 turns ON the OFF-holding FET 123a (timing t9). As a result, electrical charge is further discharged from the gate of the IGBT 110d via the OFF-holding FET 123a, and the OFF-state of the IGBT 110d is held.

In FIG. 2, when the current flowing to the IGBT 110d becomes greater than the excess current threshold, the excess current detection circuit 126 judges that an excess current is flowing to the IGBT 110d. When judged by the excess current detection circuit 126 that the excess current is flowing, the control circuit 128 turns ON the disconnecting FET 124a. As a result, electrical charge is discharged from the gate of the IGBT 110d via the disconnecting resistor 124b. Therefore, the gate voltage becomes lower than the ON/OFF threshold voltage more gradually than when decreased by the OFF-drive circuit 122, and the IGBT 110d is turned OFF.

In addition, when the current flowing to the IGBT 110d becomes greater than the short-circuit current threshold, the short-circuit detection circuit 127 judges that a short-circuit state has occurred in which both the IGBT 110a and the IGBT 110d are turned ON. When judged by the short-circuit detection circuit 127 that the short-circuit state has occurred, the control circuit 128 turns ON the disconnecting FET 124a and turns OFF the IGBT 110d in a manner similar to that when the excess current is judged to be flowing.

Furthermore, when an abnormal state in which the gate voltage does not decrease occurs as a result of failure in the IGBT 110d, as shown in FIG. 4, the IGBT 110d does not turn OFF at the timing (timing t8) at which the IGBT 110d is turned OFF in the normal state, even when the drive signal gives the instruction to turn OFF the IGBT 110d (timing t5), and the control circuit 128 turns OFF the ON-drive FET 121a (timing t6) and turns ON the OFF-drive FET 122a (timing t7). However, the control circuit 128 turns ON the OFF-holding FET 123a (timing t10) after the timing (timing t6) at which the ON-drive FET 121a is turned OFF, the timing (timing t7) at which the OFF-drive FET 122a is turned ON, and the timing (timing t9) at which the OFF-holding FET 123a is turned ON in the normal state, and after the elapse of a fixed period of time Toff (a predetermined period of time) from the timing (timing t5) at which the drive signal switches from that giving the instruction to turn ON the IGBT 110d to that giving the instruction to turn OFF the IGBT 110d. As a result, electrical charge is quickly discharged from the gate of the IGBT 110d via the OFF-holding FET 123a. Therefore, the gate voltage becomes lower than the ON/OFF threshold voltage, and the IGBT 110d is forcibly turned OFF (timing t10). Thus, the IGBT 110d can be turned OFF with certainty, even when the gate voltage does not decrease due to failure in the IGBT 110d and the IGBT 110d cannot be turned OFF regardless of the drive signal giving the instruction to turn OFF the IGBT 110d.

When the drive signal switches from that giving the instruction to turn OFF the IGBT 110d to that giving the instruction to turn ON the IGBT 110d before the elapse of the fixed period of time Toff (before the elapse of the predetermined period of time), the IGBT 110d is not forcibly turned OFF by the OFF-holding FET 123a being turned ON.

Here, the period from the timing (timing t7) at which the OFF-drive FET 122a is turned ON to the timing (timing t10) at which the OFF-holding FET 123a is turned ON is set to a period of time that is a time constant or more. The time constant is determined by a product of the combined capacity between the gate and the emitter of the IGBT 110d including the capacity of the ON-drive capacitor 121c in FIG. 2, and the resistance value of the OFF-drive resistor 122b. In other words, after the OFF-drive FET 122a is turned ON, the control circuit 128 turns ON the OFF-holding FET 123a and forcibly turns OFF the IGBT 110d after the elapse of an period of time that is the time constant or more, the time constant being determined by the product of the combined capacity between the gate and the emitter of the IGBT 110d including the capacity of the ON-drive capacitor 121c, and the resistance value of the OFF-drive resistor 122b.

Next, effects will be described. According to the present embodiment, in the normal state, when the drive signal switches from that giving the instruction to turn ON the IGBT 110d to that giving the instruction to turn OFF the IGBT 110d, the control circuit 128 turns OFF the ON-drive FET 121a and turns ON the OFF-drive FET 122a. As a result, electrical charge is discharged from the gate of the IGBT 110d. Therefore, the gate voltage becomes lower than the ON/OFF threshold voltage, and the IGBT 110d is subsequently turned OFF (timing t8). When the abnormal state occurs in which the gate voltage does not decrease due to failure in the IGBT 110d, as shown in FIG. 4, the IGBT 110d does not turn OFF at the timing (timing t8) at which the IGBT 110d is turned OFF in the normal state. However, the control circuit 128 turns OFF the IGBT 110d (timing t10) using a switching element other than the OFF-drive FET 122a (other than the OFF-drive switching element) or, to be specific, using the OFF-holding FET 123a, after the elapse of the fixed period of time Toff from the timing (timing t5) at which the drive signal switches from that giving an ON instruction to that giving an OFF instruction. Therefore, even when the gate voltage of the IGBT 110d does not decrease, the IGBT 110d can be turned OFF. Thermal damage to the IGBT 110d can thereby be prevented.

According to the present embodiment, as shown in FIG. 4, when the drive signal switches from that giving the instruction to turn ON the IGBT 110d to that giving the instruction to turn OFF the IGBT 110d (t5), the control circuit 128 turns ON the OFF-drive FET 122a (timing t7). Then, the control circuit 128 subsequently turns OFF the IGBT 110d (timing t10) using the time drive circuit other than the OFF-drive FET 122a or, to be specific, using the OFF-holding FET 123a. Therefore, the IGBT 110d can be turned OFF even when the gate voltage of the IGBT 110d does not decrease, without affecting the operations of the control circuit 128, namely turning ON the OFF-drive FET 122a.

According to the present embodiment, as shown in FIG. 4, when the drive signal switches from that giving the instruction to turn ON the IGBT 110d to that giving the instruction to turn OFF the IGBT 110d (timing t5), the control circuit 128 turns OFF the ON-drive FET 121a (timing t6). Then, the control circuit 128 subsequently turns OFF the IGBT 110d (timing t10) using the time drive circuit other than the OFF-drive FET 122a or, to be specific, using the OFF-holding FET 123a. Therefore, the IGBT 110d can be turned OFF even when the gate voltage of the IGBT 110d does not decrease, without affecting the operations of the control circuit 128, namely turning OFF the ON-drive FET 121a.

According to the present embodiment, when the drive signal switches from that giving the instruction to turn OFF the IGBT 110d to that giving the instruction to turn ON the IGBT 110d before the elapse of the fixed period of time Toff, the IGBT 110d is not forcibly turned OFF by the OFF-holding FET 123a being turned ON. When the drive signal switches from that giving the instruction to turn OFF the IGBT 110d to that giving the instruction to turn ON the IGBT 110d before the elapse of the fixed period of time Toff, the IGBT 110d is not required to be turned OFF. Therefore, the IGBT 110d can be turned ON in adherence to the drive signal.

According to the present embodiment, when the drive signal switches from that giving the instruction to turn ON the IGBT 110d to that giving the instruction to turn OFF the IGBT 110d, the control circuit 128 turns ON the OFF-drive FET 122a. As a result, electrical charge is discharged from the gate of the IGBT 110d. When an period of time elapses that is the time constant or more, the time constant being determined by the product of the combined capacity between the gate and the output terminal of the IGBT 110d including the capacity of the ON-drive capacitor 121c, and the resistance value of the OFF-drive resistor 122b, electrical charge is sufficiently discharged from the gate of the IGBT 110d. Then, the IGBT 110d is subsequently turned OFF by the time drive circuit other than the OFF-drive FET 122a. Therefore, the IGBT 110d can be turned OFF even when the gate voltage of the IGBT 110d does not decrease, without affecting the operations of the control circuit 128, namely discharging electrical charge from the IGBT 110d by the OFF-drive FET 122a.

According to the present embodiment, as a result of the OFF-holding FET 123a being included, the OFF-state of the IGBT 110d can be held.

According to the present embodiment, even when the gate voltage of the IGBT 110d does not decrease, the IGBT 110d can be turned OFF using the OFF-holding FET 123a. Therefore, circuit configuration can be simplified.

According to the present embodiment, as shown in FIG. 4, when the drive signal switches from that giving the instruction to turn ON the IGBT 110d to that giving the instruction to turn OFF the IGBT 110d, and the gate voltage of the IGBT 110d becomes the OFF-holding threshold or lower, the control circuit 128 turns ON the OFF-holding FET 123a (timing t9). Then, the control circuit 128 subsequently forcibly turns OFF the IGBT 110d using the OFF-holding FET 123a (timing t10). Therefore, the IGBT 110d can be turned OFF even when the gate voltage of the IGBT 110d does not decrease, without affecting the operations of the control circuit 128, namely turning ON the OFF-holding FET 123a when the gate voltage of the IGBT 110d becomes the OFF-holding threshold or lower.

According to the present embodiment, an example is given in which the OFF-holding FET 123a is turned ON and the IGBT 110d is forcibly turned OFF, after the elapse of the fixed period of time Toff from the timing at which the drive signal switches from that giving the instruction to turn ON the IGBT 110d to that giving the instruction to turn OFF the IGBT 110d. However, the present invention is not limited thereto.

The period of time Toff may be set based on the voltage between the collector and the emitter of the IGBT 110d (voltage between the input and output terminals). The period of time Toff is preferably set to be shorter, the lower the voltage between the collector and the emitter of the IGBT 110d is. The gate of the IGBT 110d is charged even when stray capacitance is disposed between the collector and the emitter. Electrical charge with which the gate of the IGBT 110d is charged when the stray capacitance is disposed between the collector and the emitter decreases, the lower the voltage between the collector and the emitter is. Therefore, discharge period of electrical charge also becomes shorter, the lower the voltage between the collector and the emitter is. The period of time Toff can therefore be set appropriately.

The period of time Toff may be set based on the temperature of the IGBT 110d. The period of time Toff is preferably set to be shorter, the lower the temperature of the IGBT 110d is. Therefore, discharge period of electrical charge from the gate of the IGBT 110d becomes shorter, the lower the temperature of the IGBT 110d is. The period of time Toff can therefore be set appropriately.

According to the present embodiment, an example is given in which the IGBT 110d is forcibly turned OFF using the OFF-holding FET 123*a*. However, the present invention is not limited thereto. The control device 12 includes the disconnecting FET 124*a* that turns OFF the IGBT 110*d* when an abnormal current flows to the IGBT 110*d*. The IGBT 110*d* may be forcibly turned OFF using the disconnecting FET 124*a*, in a manner similar to that when the OFF-holding FET 123*a* is used. The IGBT 110*d* can be turned OFF even when the gate voltage of the IGBT 110*d* does not decrease. Circuit configuration can be simplified.

The present invention may be embodied in other specific forms without departing from the spirit or essential characteristics thereof. The present embodiments are therefore to be considered in all respects as illustrative and not restrictive, the scope of the present invention being indicated by the appended claims rather than by the foregoing description and all changes which come within the meaning and range of equivalency of the claims are therefore intended to be embraced therein.

What is claimed is:

1. An electronic device comprising:
    a control switching element arranged in an inverter to drive an electric motor, wherein the control switching element has a control terminal and is configured to be turned ON and OFF selectively by controlling a voltage applied to the control terminal;
    an ON-drive switching element configured to be turned ON and OFF selectively, wherein the ON-drive switching element is electrically connected to the control terminal and configured to charge the control terminal with electrical charge by being turned ON;
    an OFF-drive switching element configured to be turned ON and OFF selectively, wherein the OFF-drive switching element is electrically connected to the control terminal and configured to discharge the electrical charge from the control terminal by being turned ON; and
    an OFF-holding switching element configured to be turned ON and OFF selectively, wherein the OFF-holding switching element is electrically connected to the control terminal and configured to forcibly discharge electric charge from the control terminal of the control switching element b being turned ON the OFF-holding switching element being turning ON for allowing hold of an OFF state of the control switching element, and
    a control circuit that is configured to receive a drive signal and is configured to control:
        i) controls the voltage at the control terminal of the control switching element by controlling ON and OFF states of both the ON-drive switching element and the OFF-drive switching element based on the drive signal,
        ii) forcibly turn OFF the OFF-holding switching element at a time when a predetermined period of time has elapsed from a timing at which the drive signal switches from an ON instruction thereof to an OFF instruction thereof, the ON instruction instructing the control switching element to turn ON, the OFF instruction instructing the control switching element to turn OFF.

2. The electronic device according to claim 1,
    the control switching element is configured to be turned ON and OFF selectively depending on the voltage which is higher or lower than a predetermined threshold voltage, wherein
    the control circuit turns ON the OFF-holding switching element to hold the OFF state of the control switching element when a voltage at the control terminal becomes equal to or lower than a threshold voltage lower than the threshold voltage for turning ON and OFF the control switching element.

3. The electronic device according to claim 2, wherein the predetermined period of time is set to include a timing at which the OFF-drive switching element is turned ON in a state where the drive signal presents the OFF instruction thereof.

4. The electronic device according to claim 3, wherein the predetermined period of time is set to include a timing at which the ON-drive switching element is turned OFF in a state where the drive signal presents the OFF instruction thereof, the turn OFF of the ON-drive switching element being earlier in the timing than the turn ON of the OFF-drive switching element.

5. The electronic device according to claim 2, comprising
    an ON-drive capacitor electrically connected between the control terminal of the control switching element and an output terminal of the control switching element, and
    an OFF-drive resistor electrically connected between the OFF-drive switching element and the control terminal of the control switching element,
    wherein the predetermined period of time is equal to or longer than a time constant, the time constant being defined by a product of a total amount of capacitance between the control terminal and the output terminal and a resistance value of the OFF-drive resistor, the total amount of capacitance including a capacitance of the ON-drive capacitor.

6. The electronic device according to claim 2, wherein the control circuit is configured to stop the control switching element from being turned OFF when the drive signal switches from the OFF instruction thereof to the ON instruction thereof before the predetermined period of time has elapsed.

7. The electronic device according to claim 2, wherein
    the control switching element has an input terminal and
    the predetermined period of time is set in accordance with a voltage across the input terminal of the control switching element and the output terminal thereof.

8. The electronic device according to claim 7, wherein the predetermined period of time is set become shorter as the voltage across the input and output terminals of the control switching element becomes lower.

9. The electronic device according to claim 2, wherein the predetermined period of time is set in accordance with temperature of the control switching element.

10. The electronic device according to claim 9, wherein the predetermined period of time is set to become shorter as the temperature becomes lower.

11. The electronic device according to claim 2, wherein the the predetermined period of time is set to include a timing at which the OFF-drive switching element is turned ON in a state where the drive signal presents the OFF instruction thereof.

12. The electronic device according to claim 2, comprising a disconnecting switching element electrically connected to the control terminal of the control switching element and configured to discharge the electric charge from the control terminal of the control switching element by being turned ON,
    wherein the control circuit is configured to control the disconnecting switching element to turn OFF the control switching element when an abnormal current passes through the control switching element.

13. The electronic device according to claim 12, wherein the control circuit is configured to control the disconnecting switching element to turn OFF the control switching element at the time when the predetermined period of time has elapsed from.

14. The electronic device according to claim 1, wherein the control circuit is configured to stop the control switching element from being turned OFF when the drive signal switches from the OFF instruction thereof to the ON instruction thereof before the predetermined period of time has elapsed.

15. The electronic device according to claim 14, wherein
the control switching element has an input terminal and
the predetermined period of time is set in accordance with
a voltage across the input terminal of the control switching element and the output terminal thereof.

16. The electronic device according to claim 15, wherein the predetermined period of time is set become shorter as the voltage across the input and output terminals of the control switching element becomes lower.

17. The electronic device according to claim 14, wherein the predetermined period of time is set in accordance with temperature of the control switching element.

18. The electronic device according to claim 17, wherein the predetermined period of time is set to become shorter as the temperature becomes lower.

* * * * *

UNITED STATES PATENT AND TRADEMARK OFFICE
CERTIFICATE OF CORRECTION

PATENT NO. : 8,610,487 B2
APPLICATION NO. : 13/268081
DATED : December 17, 2013
INVENTOR(S) : Itou et al.

It is certified that error appears in the above-identified patent and that said Letters Patent is hereby corrected as shown below:

On the title page, item (54) and in the specification, column 1, line 1, correct the title to read:

ELECTRONIC DEVICE WITH SWITCHING ELEMENT<u>S</u> DRIVEN BY CONTROL VOLTAGE

In the Claims:

At column 11, line 21, please amend claim 1 as follows:

1. An electronic device comprising:

a control switching element arranged in an inverter to drive an electric motor, wherein the control switching element has a control terminal and is configured to be turned ON and OFF selectively by controlling a voltage applied to the control terminal;

an ON-drive switching element configured to be turned ON and OFF selectively, wherein the ON-drive switching element is electrically connected to the control terminal and configured to charge the control terminal with electrical charge by being turned ON;

an OFF-drive switching element configured to be turned ON and OFF selectively, wherein the OFF-drive switching element is electrically connected to the control terminal and configured to discharge the electrical charge from the control terminal by being turned ON; and an OFF-holding switching element configured to be turned ON and OFF selectively, wherein the OFF-holding switching element is electrically connected to the control terminal and configured to forcibly discharge electric charge from the control terminal of the control switching element [[b]]<u>by</u>

Signed and Sealed this
Third Day of June, 2014

Michelle K. Lee
*Deputy Director of the United States Patent and Trademark Office* being turned ON, the OFF-holding switching element being turning ON for allowing hold of an OFF state of the control switching element, and a control circuit that is configured to receive a drive signal and is configured to ~~control~~:

i) ~~controls~~control the voltage at the control terminal of the control switching element by controlling ON and OFF states of both the ON-drive switching element and the OFF-drive switching element based on the drive signal, and ii) forcibly turn OFF the OFF-holding switching element at a time when a predetermined period of time has elapsed from a timing at which the drive signal switches from an ON instruction thereof to an OFF instruction thereof, the ON instruction instructing the control switching element to turn ON, the OFF instruction instructing the control switching element to turn OFF.